United States Patent [19]
Lin et al.

[11] Patent Number: 5,468,999
[45] Date of Patent: Nov. 21, 1995

[54] LIQUID ENCAPSULATED BALL GRID ARRAY SEMICONDUCTOR DEVICE WITH FINE PITCH WIRE BONDING

[75] Inventors: Paul T. Lin; Michael B. McShane, both of Austin, Tex.

[73] Assignee: Motorola, Inc., Schaumburg, Ill.

[21] Appl. No.: 249,602

[22] Filed: May 26, 1994

[51] Int. Cl.[6] .......................... H01L 23/02; H01L 23/12; H01L 23/48
[52] U.S. Cl. .......................... 257/784; 257/700; 257/701; 257/702; 257/704; 257/738; 257/780; 257/787
[58] Field of Search .................................. 257/666, 700, 257/701, 703, 704, 705, 706, 710, 734, 737, 738, 780, 784, 787, 702

[56] References Cited

U.S. PATENT DOCUMENTS

| | | | |
|---|---|---|---|
| 4,618,879 | 10/1986 | Mizukoshi et al. | 357/74 |
| 4,643,935 | 2/1987 | McNeal et al. | 428/157 |
| 4,975,765 | 12/1990 | Ackermann et al. | 257/737 |
| 5,091,772 | 2/1994 | Kohara et al. | 257/784 |
| 5,091,825 | 2/1992 | Hill et al. | 361/404 |
| 5,107,325 | 4/1992 | Nakayoshi | 357/69 |
| 5,111,989 | 5/1992 | Holdgrafer et al. | 228/110 |
| 5,216,278 | 6/1993 | Lin et al. | 257/688 |
| 5,359,227 | 10/1994 | Liang et al. | 257/784 |

FOREIGN PATENT DOCUMENTS 56-51851  5/1981  Japan ............................. H01L 23/04

Primary Examiner—Sara W. Crane
Assistant Examiner—Carl Whitehead, Jr.
Attorney, Agent, or Firm—Patricia S. Goddard

[57] ABSTRACT

A ball grid array semiconductor device (10) includes a package substrate (14 or 16) having a plurality of conductive traces (18), bond posts (20), and conductive vias (22). A semiconductor die (12) is mounted to the package substrate. Orthogonal wire bonds (28) are used to electrically connect staggered bond pads (26) to corresponding bond posts (20) on the substrate. A liquid encapsulant (40) is used to cover the die, the wire bonds, and portions of the package substrate. In another embodiment, a package substrate (50) includes a lower bonding tier (52) and an upper bonding tier (54). Wire bonds (60) are used to electrically connect an outer row of bond pads (64) to bond posts (20) of lower tier (52), while wire bonds (62) are used to electrically connect an inner row of bond pads (64) to bond posts (20) of an upper tier (54). The loop height of wire bonds (60) is smaller than that of wire bonds (62).

21 Claims, 2 Drawing Sheets

LIQUID ENCAPSULATED BALL GRID ARRAY SEMICONDUCTOR DEVICE WITH FINE PITCH WIRE BONDING

FIELD OF THE INVENTION

The present invention relates generally to semiconductor devices, and more specifically to Ball Grid Array (BGA) semiconductor devices.

BACKGROUND OF THE INVENTION

Customers of semiconductor products are continually demanding smaller and smaller semiconductor devices. A semiconductor package accounts for a significant portion of the overall semiconductor device size. Ideally many customers would like to receive a bare silicon die as opposed to a packaged die. While semiconductor manufacturers would like to supply customers with bare silicon die, they are faced with the problem known as the "Known Good Die" (KGD) problem. As semiconductor manufacturers work to supply customers with bare silicon die, a method for insuring proper device operation at the die level is necessary. Yet at this time, a testing procedure for testing full functionality of unpackaged semiconductor die is not available. Until the KGD problem is solved, semiconductor manufacturers are forced to package individual semiconductor die into testable packages which are as close to the die size as possible.

Semiconductor packages which are currently available and are accepted as industry standards generally do not accomplish the goal of having the final package device be as close in size to the semiconductor die as possible. For example, traditional transfer molded plastic packages with metal lead frames are on the order of six to sixty times larger than die that are packaged inside. Ceramic or molded Pin Grid Array (PGA) devices are on the order of four to ten times larger than the die packaged inside.

An emerging package which has achieved a significant reduction in the final package size as compared to the die size is an Over-Molded Pad Array Carrier (OMPAC) package, also known as a plastic Ball Grid Array (BGA) package. As presently manufactured, plastic BGAs are on the order of two to eight times larger than the semiconductor die packaged inside. While BGAs have achieved a significant reduction in the final package device size, they are limited by the manufacturing processes used to make both the die and the package. For example, although the conductive traces and pads on a BGA substrate can be lithographically defined to achieve a very fine pitch, the bond pad pitch on the semiconductor die is typically restricted from achieving a comparable pitch due to spacing and design rules used to account for wire bonding methods and tolerances, such as capillary tool interference during wire bonding. The bond pad pitch accordingly restricts further reductions in the package substrate size. Another limitation to bond pad and conductive trace pitch relates to the problem of wire sweep caused by the transfer molding process. Bonding wires which are used to electrically connect the bond pads of the die to the conductive traces of the substrate may be deformed during the molding process as the molding compound flows across the die and the package substrate. The sweeping of the wires during a molding process may be so severe so as to cause electrical shorts between adjacent wires. Making the traces and bond pads farther apart reduces the adverse affects of wire sweep.

Accordingly, a need exists for a packaged semiconductor device having an overall size closer to the die size in existing semiconductor packages without many of the disadvantages present in existing packages. Specifically, this need exists for semiconductor devices having a large number of input and output terminals, because such devices traditionally have package sizes much larger than the semiconductor die and correspondingly large packages.

SUMMARY OF THE INVENTION

In one form the present invention is a ball grid array semiconductor device. The device includes a package substrate having a first surface and an opposing second surface. The first surface has a first plurality of conductive traces and has a conductive bond post at an end of each trace. The second surface has a plurality of conductive terminal pads arranged in an array configuration and electrically connected to the plurality of conductive traces on the first surface. A semiconductor die is mounted on the first surface of the package substrate. The die has sides and a periphery, and has a plurality of bond pads located about the periphery. The plurality of bond pads exists in an inner row and an outer row of bond pads along each die side. A first plurality of wire bonds electrically connects the plurality of bond pads to the bond posts of the first plurality of conductive traces. Each wire bond is bonded to be approximately orthogonal to a side of the die, and is formed of a conductive wire having a diameter of less than approximately 25 µm. A plurality of conductive balls is attached to the plurality of conductive terminal pads on the second surface of the package substrate. A glob top encapsulant covers the die, the first plurality of wire bonds, and at least a portion of the first surface of the package substrate. Another form of the invention includes a method for making such a device.

DETAILED DESCRIPTION OF A PREFERRED EMBODIMENT

The present invention, in one form, is a ball grid array (BGA) device wherein packaging used to house a semiconductor die is very close in size to the size of the die itself. The minimized package size is achieved through a combination of space saving design and manufacturing features. As used in accordance with the present invention, a semiconductor die includes at least two rows of bond pads along each die edge. In one form these bond pads are staggered along each edge so that the pitch between adjacent bond pads can be reduced as compared to the pitch of adjacent pads in a single row, thereby permitting the pitch of conductive pads on the package substrate to be reduced and the overall package substrate area made smaller. The bond pads are connected to bond posts on the package substrate using conductive wires which are bonded to be orthogonal to a die side. Orthogonal wire bonds facilitate more compact circuitry on the package substrate and minimize the wire bond lengths. In addition the wire bonds are made from a small diameter conductive wire, for example wire having a diameter of less than 25 µm. A liquid encapsulant is dispensed over the die and wire bonds to form a very low profile package device and also avoid the problem of wire sweep. The liquid encapsulant has a low stress as compared to transfer molding compounds, and can therefore alleviate problems of package substrate warpage.

These and other features and advantages will be more clearly understood from the following detailed description taken in conjunction with the accompanying drawings. It is important to point out that the illustrations may not necessarily be drawn to scale, and that there may be other embodiments of the present invention which are not specifically illustrated.

Figure 1:
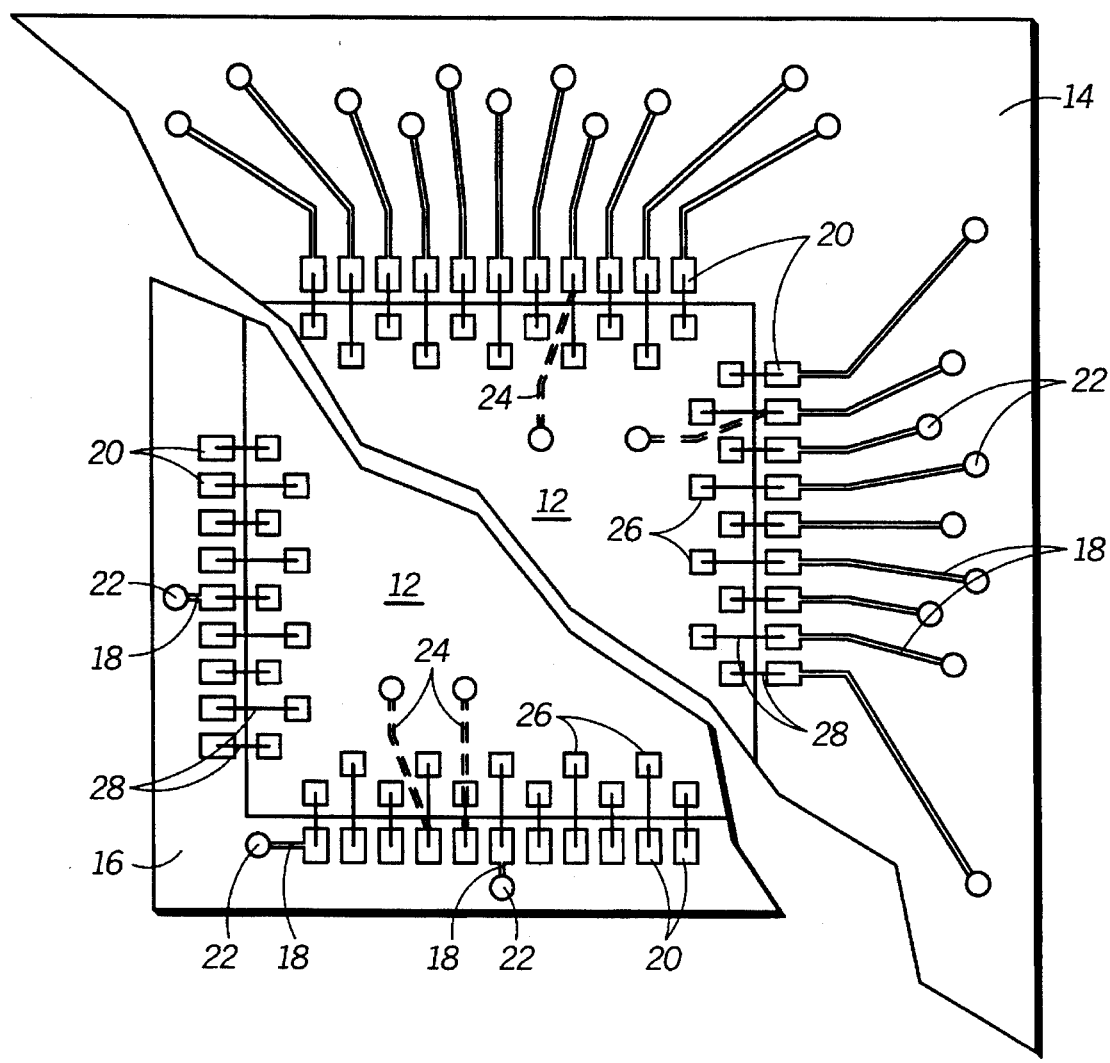
FIG. 1 is a top down view of a semiconductor die mounted alternatively to two different package substrates in accordance with the present invention.

FIG. 1 is a top down view of a semiconductor die 12 mounted to a package substrate. As illustrated in FIG. 1, die 12 is mounted onto alternative package substrates, specifically a package substrate 14 and a package substrate 16. While either type of package substrate 14 or 16 may be used in accordance with the present invention, different substrates are illustrated in FIG. 1 to demonstrate further reductions in the overall package size which may be achieved in accordance with the present invention. In preferred embodiments of the present invention, the package substrate is formed from an organic epoxy-glass resin based substrate material, such as bismaleimidetriazine (BT) resin or FR-4 board. Other printed circuit or printed wiring board materials may also be used. The package substrate includes a plurality of conductive traces 18 which are lithographically defined on a surface of the substrate. Each conductive trace 18 includes a bond post 20 at one end and a conductive via or through hole 22 at the other end. As illustrated, on package substrate 14 the conductive traces 18 extend from the bond posts 20 outward; however, conductive traces may alternatively extend inward beneath the semiconductor die. Such a configuration is illustrated in FIG. 1 by phantom conductive traces 24 which terminate at conductive through-holes which are located beneath semiconductor die 12. Note that as illustrated, package substrate 16 does not include extensive conductive traces beyond the die periphery, rather bond posts 20 of package substrate 16 are primarily routed beneath semiconductor die 12 or just slightly beyond the bond posts 20. By avoiding a fan out of conductive traces 18, package substrate 16 can be made much smaller than package substrate 14, as FIG. 1 illustrates. Not all conductive traces are illustrated on package substrate 16 for the sake of clarity.

Conductive traces 18 and bond posts 20 are formed on a substrate surface using conventional lithographic methods. For example, a copper layer may be laminated to or deposited on the resin substrate and subsequently patterned using a lithographic masking operation followed by an etch. The copper pattern may then be plated with gold or a combination of nickel and gold. Conductive vias 22 are also formed using conventional processes. For example, holes may be drilled through the resin substrate followed by deposition of copper and nickel and gold plating on sidewalls of the holes. Conductive traces 18 and bond posts 20 can be lithographically defined to a pitch quite smaller than the traditional bond pad pitch of a semiconductor die. However, the bond posts (and bond pads) must be sufficiently wide to be able to wire bond to the bond posts. To take advantage of the finer bond post pitch capability yet maintain appropriate spacing and design rules to permit wire bonding, in accordance with the present invention, semiconductor die 12 is modified to include two rows of bond pads 26 along each side of the die. As illustrated in FIG. 1, an inner row of bond pads on each side is staggered with respect to an outer row of bond pads along the same side. By staggering the inner and outer rows of bond pads, the effective pitch can be reduced from approximately 107 µm for a single row of pads (for pads 85 µm wide with 22 µm spacing) to a pitch on the order of 70–76 µm (depending on the wire diameter used and assuming the edges of adjacent bond pads are colinear).

Each bond pad 26 is electrically connected to a corresponding bond post 20 by a conductive wire or wire bond 28. Preferably wire bonds 28 are formed from gold wire having a diameter of less than 25 µm so that wire bond pitch can be further reduced. For example using the pitches presented above, a bond pad pitch of about 76 µm may be achieved using a 25 µm gold wire while the pitch can be further reduced to about 70 µm using a 20 µm gold wire. Overall, as a result of using smaller diameter wire and staggered bond bonds, the wire pitch (the center-to-center spacing) of adjacent wire bonds is on the order of less than 75 µm. Wire bonds 28 may be ball bonded, or preferably wedge bonded to the bond pads and the bond posts. Wedge bonding is preferred because wedge bonding does not deform the conductive wire to the extent that conventional ball bonding does. For example, upon forming a ball bond, the wire portion used to form the ball end becomes two and one-half to three time larger than the wire diameter. In contrast, a wedge bonded wire will only deform to be one and one-half to two times larger than the wire diameter. Thus, bond pads can be made smaller if wedge bonding is employed. Another advantage of using wedge bonding is that the package substrate can be made of a less-expensive resin-based material having a low glass transition temperature (e.g. FR-4), since wedge bonding of gold wire can be accomplished at about 150° C. or lower whereas ball bonding is typically done at 200° C. or higher. Each wire bond 28 is bonded such that the wire bond 28 is orthogonal to a die side. In other words, each wire bond is normal to (at 90° from) a die side. Orthogonal wire bonds permit overall shorter wire bond lengths, thereby reducing the probability of wire sweep.

Figure 2:
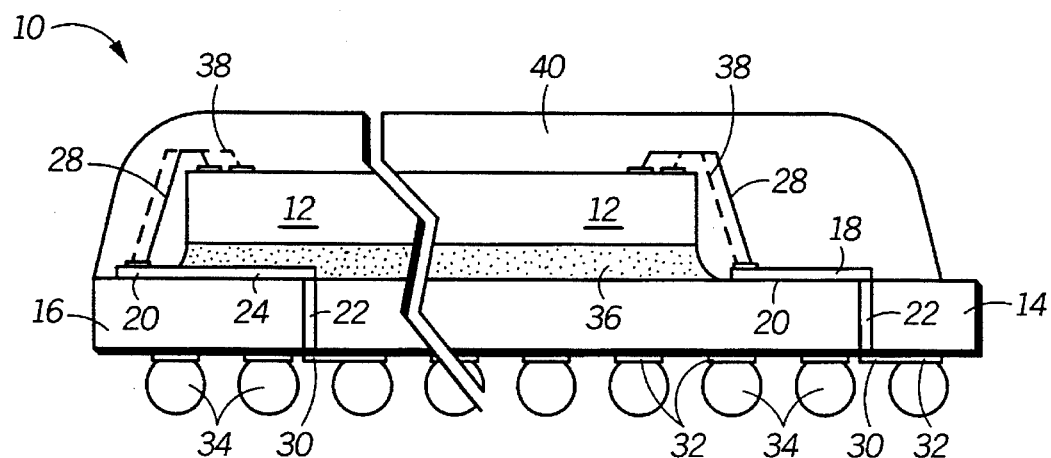
FIG. 2 is a cross sectional view of the die and package substrates illustrated in FIG. 1 as encapsulated in accordance with the present invention.

FIG. 2 is a cross sectional view illustrating die 12 mounted on package substrates 14 and 16, as a final packaged semiconductor device 10. Like reference numerals in FIGS. 1 and 2, as well as in the remaining figures, designate identical or corresponding parts throughout the several views. As is evident in FIG. 2, package substrate 14 includes conductive traces 18 which fan outward from the die, whereas package substrate 16 includes conductive traces such as conductive trace 24 illustrated in phantom in FIG. 1, which fans beneath die 12. The conductive traces on the top of each of the substrates are routed through the substrate by way of conductive vias 22. Although not apparent in FIG. 2, conductive vias 22 are typically openings in the substrate having plated sidewalls (as opposed to being filled vias). On the bottom of each of the substrates the conductive vias 22 are further routed by a plurality of conductive traces 30 (not all shown) which terminate into conductive terminal pads 32. Attached to each conductive terminal pad 32 is a conductive ball 34 such as conductive solder balls or conductor coated polymer spheres. In accordance with the present invention, a configuration of conductive terminal pads and conductive balls on the bottom of the package substrate is in an array configuration as opposed to being in a purely peripheral configuration. Array configurations allow high terminal or pin count devices to have smaller footprints than peripheral configuration because substrate area beneath the die is utilized for terminal connections.

Die 12 is mounted to the substrate using a conventional die attach material 36 such as a conductive or a non-conductive epoxy. Once die 12 is mounted, wire bonds 28 are formed to electrically connect the die to the conductive traces on the substrate. As illustrated in FIG. 2, wire bond 28 in the left portion of the figure is connecting an outer row bond pad to a bond post 20 on substrate 16. In this same portion of the figure, a wire bond 38 is shown in phantom, indicating that in another cross sectional view an inner row bond pad would be connected to a similar bond post. Likewise in the right portion of FIG. 2, a conductive wire 28 is connecting an inner row bond pad with a bond post 20 on substrate 14. Another phantom wire bond 38 is also illustrated in the right portion of the figure to illustrate that an outer row bond pad would be connected to a similar bond post in another cross sectional view. As illustrated in FIG. 2, the wire bonds used to connect both the inner and outer row of bond pads have the same loop height, whereas in other embodiments of the present invention subsequently described, loop heights of inner and outer row wire bonds are varied.

FIG. 2 also illustrates a liquid encapsulant 40, also known as a glob top encapsulation. Encapsulant 40 is an epoxy resin based material which is dispensed over die 12 and wire bonds 28 and 38 and portions of the package substrate to protect the die from environmental influences. In a preferred form, encapsulant 40 is dispensed upon die 12 in a liquid form. The height of the encapsulant is controlled to insure that each of the wire bonds is adequately covered, while trying to maintain the smallest height above the package substrate as possible. To control the flow of the encapsulant over the die and substrate, resin dams or other means for constraining or containing the encapsulant flow known within the industry may be used. As an alternative to dispensing encapsulant 40 in the liquid form, a solid pellet may be placed on semiconductor die 12 and subsequently heated so that the encapsulant melts and flows over die 12 and wire bonds 28. Using either method, the encapsulant is subsequently cured to solidify the material for adequate protection. A significant advantage in using a liquid encapsulant as opposed to a transfer molded encapsulant is the avoidance of the wire sweep problem. Transfer molding processes force a molding compound into a mold cavity at great speed and force, thereby creating great potential for deforming the wire bonds. The problem is magnified when smaller diameter wire is used because the wires are less stiff or rigid. In contrast, a liquid encapsulant is much less forceful, yet can offer the same degree of environmental protection. Moreover, liquid encapsulants can generally achieve a lower encapsulant height above the package substrate as compared to transfer molded packages. A further advantage of using a liquid encapsulant is that formulations for liquid encapsulants typically have lower stress levels upon curing, and are more flexible than transfer molding compounds. Accordingly, use of a liquid encapsulating material will reduce package warpage and decrease the chance of stress induced delaminations within the packaged device.

Figure 3:
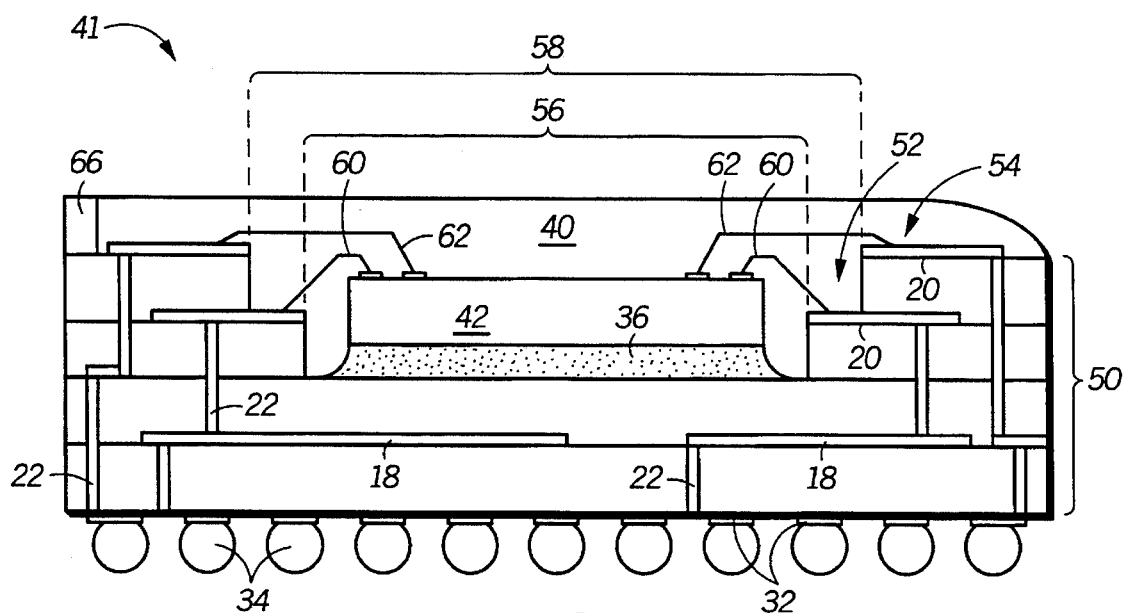
FIG. 3 is a cross sectional view of a semiconductor device having a multi-tiered package substrate, also in accordance with the present invention.

FIG. 3 is a cross sectional view of a semiconductor device 41 demonstrating an alternative packaging configuration in accordance with the present invention. A semiconductor die 42 is mounted to a package substrate 50. Like package substrates 14 and 16, package substrate 50 is preferably a BT resin, FR-4 board, or other epoxy-glass based substrate such as those used in printed circuit boards. Elements of substrate 50 which correspond to those previously discussed continue to be identified with the same reference numerals. Unlike substrates 14 and 16, package substrate 50 is multi-tiered, including a lower bonding shelf or tier 52 and an upper bonding shelf or tier 54. To form tiers 52 and 54, two separate recesses are formed in individual substrate layers of substrate 50 before being laminated together. A first recess 56 is formed to create first bonding tier 52, while a second recess 58 is formed to create second bonding tier 54. Rather than forming two distinct recesses within substrate 50, a single recess could be formed while still establishing two different bonding levels. For example, recess 58 could be the only recess formed in substrate 50, yet wire bonds could be bonded to both tier 54 and to the surface on which semiconductor die 42 is mounted, resulting in two different bonding levels on the substrate.

Semiconductor die 42 is mounted within recess 56 and is attached to the substrate by die attach material 36. Bond pads of die 42 are electrically connected to bond posts 20 of substrate 50 by a plurality of wire bonds 60 and 62, which may be either ball or wedge wire bonds. As illustrated in FIG. 3, wire bonds 60 are used to bond an outer row of bond pads to bond posts 20 of lower tier 52. Wire bonds 62 are used to bond an inner row of bonds pads to bond posts 20 of upper tier 54. None of wire bonds 60 or 62 illustrated in FIG. 3 are shown as being hidden because each wire bond is present within the same cross sectional view. In other words, wire bond 60 and 62 lie within the same vertical plane and are nested one within the other. This concept is more clearly illustrated in FIG. 4, which is a top down view of semiconductor die 42 as it is mounted onto substrate 50.

Figure 4:
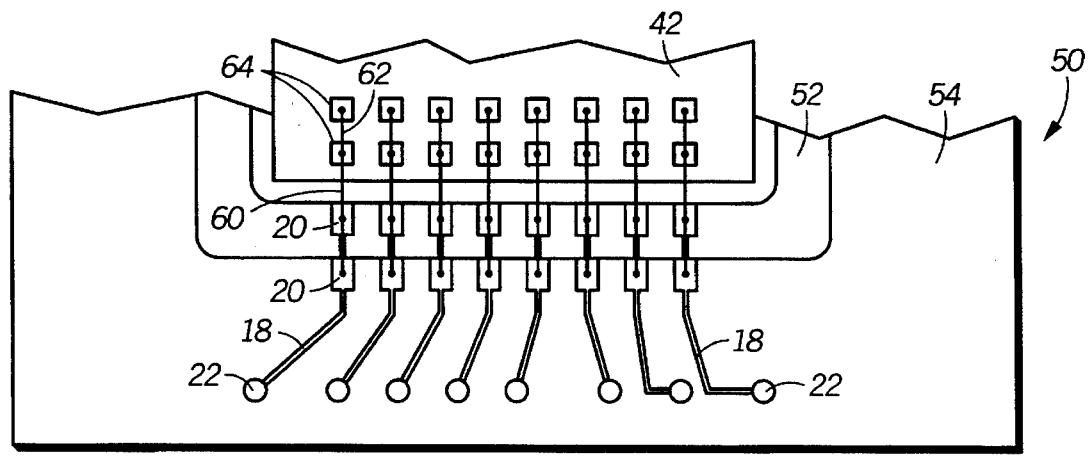
FIG. 4 is a partial top down view of the semiconductor device of FIG. 3 without the encapsulation.

As FIG. 4 indicates, a plurality of bond pads 64 of die 42 are present in two rows along the die side, but are not staggered. Rather, the inner and outer row of bond pads are aligned with one another. As illustrated in FIG. 4, wire bonds 60 and 62 overlie one another within each particular vertical column of bond pads so that it appears as though only one wire bond is present. To distinguish the two wire bonds in FIG. 4, dots have been included at the ends of each of the wire bonds 60 and 62, although this is not intended to indicate that the wire bonds are ball bonds. As mentioned earlier, preferably the wire bonds are wedge bonded to the pads and posts. Short circuiting can be avoided between overlying wire bonds 60 and 62 by forming the wires with differing loop heights. For instance, a loop height of wire bonds 60 (which connect the outer row of bond pads to the lower tier of bond posts) may be a low loop on the order of 100–120 µm above the die surface and the height of wire bonds 62 (which connect the inner row of bond pads to the upper tier of bond posts) may be on the order of 140–160 µm. Loop heights can be controlled by appropriate programming of a conventional wire bonding apparatus. In bonding wire bonds 60 and 62 as illustrated in FIG. 3, it is preferred that all the lower tier (smaller loop-height) wire bonds 60 be bonded prior to bonding any of the upper tier (larger loop height) wire bonds 62. Such a sequence is easier to program into a bonding machine and is also faster.

While there is a relatively small clearance window between wire bonds 60 and 62, use of a liquid encapsulant 40 such as that previously described may be used to avoid inadvertent touching of overlying wire bonds during encapsulation. An overlying wire bond configuration such as that illustrated in FIGS. 3 and 4 would not be possible with traditional transfer molding processes due to the high probability of wire sweep resulting in short circuiting of the wire bonds. As mentioned above, a dam, such as dam 66 illustrated in FIG. 3 may be included on the package substrate to constrain the flow of the liquid encapsulant upon dispensing or reflow. Dam 66 is shown on only one-half of the device illustrated in FIG. 3, indicating that the feature is optional. A significant advantage of using a multi-tiered package substrate in accordance with the present invention is the capability of accommodating a semiconductor die with a very large number of bond pads in a smaller package area. Using the configuration of bond pads and wire bonds illustrated in FIGS. 3 and 4, theoretically the number of input and output terminals on the die can be doubled as compared to traditional BGA packaging methods. Another advantage is that the use of a multilayer substrate permits integration of power and ground planes within the substrate for improved device performance.

Figure 5:
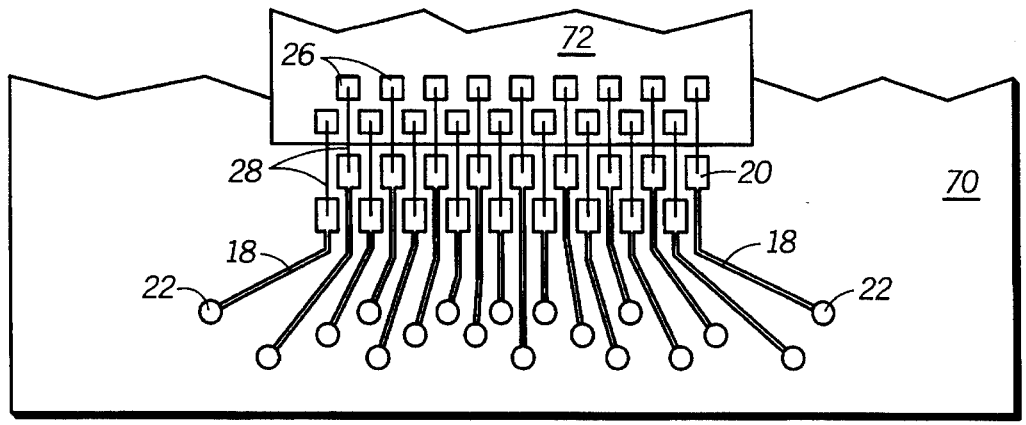
FIG. 5 is a partial top down view of a semiconductor die mounted on a package substrate also in accordance with the present invention.

FIG. 5 is a top down illustration demonstrating yet another package substrate and bond pad configuration suitable for practicing the present invention. A package substrate 70 includes conductive traces 18, bond posts 20 and conductive vias 22 such as those previously described; however, in contrast to previously described substrates, bond posts 20 of substrate 70 are arranged in a staggered configuration. The staggered bond posts mimic the staggering of bond pads 26 of a semiconductor die 72. By staggering the bond posts on the package substrate like the bond pads on the semiconductor die, the lengths of wire bonds 28 used to connect the die to the package substrate are substantially equal throughout the device. Substantially equal wire bond lengths make the wire bonding operation simpler. Furthermore, staggering both the bond pads and bond posts permits overall shorter wire bond lengths to avoid wire sweep problems. Short wire bonds are also preferable to lower inductance of the wire bonds, which naturally increase as the wire diameter is reduced. Preferably, the wire bond lengths are on the order of 125–250 µm, and most preferably are less than 225 µm. Wire bond length will, of course, be dependent on die thickness. Note that wire bond lengths as measured in the industry are typically not the true lengths of the individual wires, but instead are a measure of the linear distance from the bonding location on the bond pad to that on the bond post. Another difference with substrate 70 and die 72 is that edges of adjacent bond posts and bond pads are line-on-line or colinear. For instance, the leftmost edge of one bond pad or bond post is in-line with the rightmost edge of an adjacent bond pad or bond post to the left, as illustrated in FIG. 5. By having adjacent bond pads and bond posts in-line the pitch is minimized.

The foregoing descriptions and illustrations contained herein demonstrate many of the advantages associated with the present invention. In particular, it has been revealed that a packaged semiconductor device size can be made close to that of the semiconductor die through the use of a combination of package design and manufacturing features. For example, the use of multiple rows of bond pads, either in a staggered or in an aligned configuration, can be used to decrease the wire bond pitch and the final device. For example, in conventional plastic BGA packages, the wire bond pitch is on the order of 107 µm, whereas a wire bond pitch in accordance with the present invention, is on the order of 76 µm or less. Moreover, the use of small diameter conductive wire (less than 25 µm) in conjunction with the use of orthogonal bonds further reduces the final package size. The use of fine wires at reduced wire bond pitches can be accommodated by using a liquid encapsulant to protect the device as compared to traditional transfer molding techniques. The liquid encapsulant provides a further benefit of low stress, thereby reducing the likelihood of package warpage.

Thus, it is apparent that there has been provided in accordance with the invention a liquid encapsulated ball grid array semiconductor device with fine pitch wire bonding and method for making the same that fully meets the needs and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not limited to any specific substrate material. Materials other than those specifically mentioned may also suitably be used. Furthermore the present invention is not specifically limited to the particular conductive trace, conductive via, bond pad, or bond post configurations illustrated. Also, any conductive traces used may extend beyond conductive through-holes or bond posts for purposes of plating, although such extensions have not been illustrated. While in practicing the present invention orthogonal bonding is preferred, exact orthogonal bonding may be difficult to control and there will likely be slight variations in the bonding direction (for example plus or minus 12°). In addition, the present invention is not limited to a particular order of wire bonding. For example wire bonds may be formed in a sequential order around the die periphery, or inner bond pads may be bonded first, followed by outer bond pads, or any other manufacturable order for forming wire bonds may be used. Also, the present invention is not limited to individually packaged die, but may be used in multichip modules as well. Therefore, it is intended that this invention encompass all such variations and modifications as fall within the scope of the appended claims.

We claim:

1. A ball grid array semiconductor device comprising:

a package substrate having a first surface and an opposing second surface, wherein the first surface has a first plurality of conductive traces formed thereon and has a conductive bond post at an end of each trace, and wherein the second surface has a plurality of conductive terminal pads arranged in an array configuration and electrically connected to the plurality of conductive traces;

a semiconductor die mounted to the package substrate, the die having a periphery and sides, and having a plurality of bond pads located about the periphery of the die, wherein the bond pads are positioned in two rows, an inner row and an outer row, along the sides of the die;

a first plurality of wire bonds electrically connecting the plurality of bond pads to the bond posts of the first plurality of conductive traces, wherein each wire bond of the first plurality is bonded to be approximately orthogonal to a side of the die, and wherein each wire bond of the first plurality is formed of a conductive wire having a diameter of less than approximately 25 µm;

a plurality of conductive balls attached to the plurality of conductive terminal pads on the second surface of the package substrate; and a glob top encapsulant covering the die, the first plurality of wire bonds, and at least a portion of the first surface of the package substrate.

2. The device of claim 1 wherein the inner row of bond pads and the outer row of bond pads are staggered with respect to one another along the die sides.

3. The device of claim 2 wherein the bond posts at the ends of the traces have a staggered configuration along the die sides.

4. The device of claim 1 wherein all wire bonds in the device have lengths of approximately 125–250 μm.

5. The device of claim 1 wherein the first plurality of wire bonds are wedge-bonded to the bond pads and the bond posts.

6. The device of claim 1 wherein the package substrate further comprises a recess formed in the first surface, and wherein the die is mounted in the recess.

7. The device of claim 6 wherein the recess includes a shelf, and wherein the shelf has a second plurality of conductive traces formed thereon, and further comprising a second plurality of wire bonds electrically connecting the second plurality of conductive traces to the semiconductor die.

8. The device of claim 7 wherein the inner row of bond pads and the outer row of bond pads are aligned with respect to one another along the die sides, and wherein the second plurality of wire bonds extend over the first plurality of wire bonds.

9. A ball grid array semiconductor device comprising
   an organic package substrate having a plurality of conductive traces terminating into a plurality of bond posts on a first surface of the substrate, and having a plurality of conductive terminal pads on a second surface of the substrate which is opposite the first surface, the plurality of conductive terminal pads being electrically connected to the plurality of conductive traces;
   a semiconductor die having a plurality of sides and having a plurality of bond pads form along the die sides, wherein the plurality of bond pads exists in an inner and an outer row of bond pads along the die sides, and wherein bond pads of the inner row are co-linearly aligned with bond pads of the outer row, the die being mounted to the package substrate;
   a plurality of wire bonds electrically connecting the plurality of bond pads of the die to the plurality of bond posts of the substrate, wherein each wire bond is formed of a conductive wire having a diameter of less than 25 μm, wherein each wire bond of the plurality of wire bonds is approximately orthogonal to a side of the die, and wherein a wire bond to a bond pad of the outer row of bond pads overlies a wire bond to a corresponding bond pad of the inner row of bond pads;
   a plurality of conductive balls attached to the plurality of conductive terminal pads on the second surface of the substrate; and
   a glob top encapsulant disposed over the die, the plurality of wire bonds, the plurality of conductive traces, and at least a portion of the first surface of the substrate.

10. The device of claim 9 wherein the organic package substrate is an epoxy-glass based substrate.

11. The device of claim 9 wherein the plurality of wire bonds comprises a plurality of wedge bonds.

12. The semiconductor device of claim 9 wherein the plurality of wire bonds comprises a first plurality of wire bonds electrically connecting the inner rows of bond pads to a first set of bond posts within the plurality of bond posts and a second plurality of wire bonds electrically connecting the outer rows of bond pads to a second set of bond posts within the plurality of bond posts, and wherein the second set is exclusive of the first set.

13. The semiconductor device of claim 12 wherein the second set of bond posts is closer to the die than the first set of bond posts.

14. The semiconductor device of claim 13 wherein the inner and outer rows of bond pads are aligned with respect to one another, and wherein each wire bond of the first plurality of wire bonds has a loop height which is larger than a loop height of each wire bond in the second plurality of wire bonds.

15. The semiconductor device of claim 13 wherein the package substrate further comprises a cavity formed in the first surface of the substrate, the cavity having a shelf therein and the die being mounted in the cavity, and wherein the first set of bond posts are formed on the first surface of the substrate, and wherein the wherein the second set of bond posts are formed on the shelf.

16. The semiconductor device of claim 9 wherein a center-to-center spacing of adjacent wires along each die side is less than approximately 75 μm.

17. A ball grid array semiconductor device comprising:
   a package substrate having a first surface and an opposing second surface, a die receiving area, a first plurality of conductive traces having a first plurality of bond posts at ends thereof, and a second plurality of conductive traces having a second plurality of bond posts at ends thereof, wherein the first plurality of bond posts and the second plurality of bond posts are staggered with respect to one another near the die receiving area;
   a semiconductor die mounted within the die receiving area of the package substrate, the die having a first plurality and a second plurality of bond pads, wherein the first plurality of bond pads establishes an inner row of bond pads and the second plurality of bond pads establishes an outer row of bond pads;
   a first plurality of wire bonds electrically connecting the first plurality of bond pads to the first plurality of bond posts, and a second plurality of wire bonds electrically connecting the second plurality of bond pads to the second plurality of bond posts, wherein each wire bond of the first and the second pluralities of wire bonds is approximately orthogonal to a side of the semiconductor die; and
   a glob top encapsulant covering the die, the first and the second pluralities of wire bonds, and at least a portion of the first surface of the package substrate.

18. The semiconductor device of claim, 17 wherein the first plurality of bond pads and the second plurality of bond pads are staggered with respect to one another.

19. The semiconductor device of claim 18 wherein the package substrate further comprises a recess which creates a shelf below the first surface, and wherein the first plurality of bond posts exists on the first surface and the second plurality of bond posts exists on the shelf.

20. The semiconductor device of claim 18 wherein the first and second pluralities of bond posts create a first row and a second row of bond posts, respectively, and wherein a leftmost edge of a first bond post of the first plurality of bond posts is co-linear with a rightmost edge of a second bond post of the second plurality of bond posts, wherein the first and the second bond posts are adjacent one another.

21. The semiconductor device of claim 18 further comprising a plurality of conductive balls attached to the second surface of the substrate and electrically connected to the semiconductor die.

* * * * *

UNITED STATES PATENT AND TRADEMARK OFFICE
CERTIFICATE OF CORRECTION

PATENT NO. : 5,468,999
DATED : November 21, 1995
INVENTOR(S) : Paul T. Lin, Michael B. McShane It is certified that error appears in the above-indentified patent and that said Letters Patent is hereby corrected as shown below:

In Col. 10, Line 12 (Claim 15, Line 6), after "and wherein" delete "the wherein".

Signed and Sealed this

Third Day of June, 1997

Attest:

BRUCE LEHMAN

Attesting Officer     Commissioner of Patents and Trademarks